US007777243B2

(12) United States Patent
Lin et al.

(10) Patent No.: US 7,777,243 B2
(45) Date of Patent: Aug. 17, 2010

(54) LIGHT EMITTING DEVICE

(75) Inventors: Yi-Shan Lin, Taipei (TW); Kuan-Hsien Tu, Taipei (TW)

(73) Assignee: Lite-On Technology Corp., Taipei (TW)

( * ) Notice: Subject to any disclaimer, the term of this patent is extended or adjusted under 35 U.S.C. 154(b) by 742 days.

(21) Appl. No.: 11/798,291

(22) Filed: May 11, 2007

(65) Prior Publication Data
US 2008/0210961 A1    Sep. 4, 2008

(30) Foreign Application Priority Data
Mar. 7, 2007    (TW) ............................. 96107821 A

(51) Int. Cl.
*H01L 33/00*    (2010.01)

(52) U.S. Cl. ............ 257/98; 257/E33.06; 257/E33.061; 257/E33.067; 257/E33.068

(58) Field of Classification Search .................. 257/98, 257/E33.06, E33.061, E33.067, E33.068
See application file for complete search history.

(56) References Cited

U.S. PATENT DOCUMENTS

| | | | | |
|---|---|---|---|---|
| 3,875,456 A * | 4/1975 | Kano et al. | ................. | 313/501 |
| 5,515,253 A * | 5/1996 | Sjobom | ...................... | 362/244 |
| 5,932,327 A * | 8/1999 | Inoguchi et al. | ............. | 428/212 |
| 6,252,254 B1 * | 6/2001 | Soules et al. | .................. | 257/89 |
| 6,501,100 B1 * | 12/2002 | Srivastava et al. | ............. | 257/79 |
| 6,521,915 B2 * | 2/2003 | Odaki et al. | ................... | 257/98 |
| 6,580,097 B1 * | 6/2003 | Soules et al. | ................ | 257/100 |
| 6,608,332 B2 * | 8/2003 | Shimizu et al. | ............... | 257/98 |
| 6,653,661 B2 * | 11/2003 | Okazaki | ....................... | 257/98 |
| 6,791,116 B2 * | 9/2004 | Takahashi et al. | ............. | 257/79 |
| 6,805,600 B2 * | 10/2004 | Wang et al. | ................... | 445/24 |
| 6,897,490 B2 * | 5/2005 | Brunner et al. | ............... | 257/98 |
| 6,933,522 B2 * | 8/2005 | Lin et al. | ....................... | 257/40 |
| 6,956,243 B1 * | 10/2005 | Chin | ........................... | 257/79 |
| 6,982,522 B2 * | 1/2006 | Omoto | ....................... | 313/502 |
| 7,029,935 B2 * | 4/2006 | Negley et al. | ................. | 438/29 |
| 7,084,435 B2 * | 8/2006 | Sugimoto et al. | ............. | 257/99 |

(Continued)

FOREIGN PATENT DOCUMENTS

JP    2007201301 A  *  8/2007

OTHER PUBLICATIONS

English Abstract of Tezuka, JP 2007201301.*

*Primary Examiner*—Wael Fahmy
*Assistant Examiner*—Hrayr A Sayadian
(74) *Attorney, Agent, or Firm*—Rosenberg, Klein & Lee

(57) ABSTRACT

A light emitting device includes: a die-mounting base having a mounting surface; a light emitting diode mounted on the mounting surface of the die-mounting base and having a top surface facing in a normal direction normal to the mounting surface of the die-mounting base; a first wavelength-converting layer of a first wavelength-converting material formed on the mounting surface of the die-mounting base, enclosing the light emitting diode, and having a top surface; and a second wavelength-converting layer of a second wavelength-converting material formed on the top surface of the first wavelength-converting layer and having a top surface that is aligned with the top surface of the light emitting diode in the normal direction, and that has an area smaller than the top surface of the first wavelength-converting layer and not smaller than the top surface of the light emitting diode.

14 Claims, 3 Drawing Sheets

U.S. PATENT DOCUMENTS

| | | | |
|---|---|---|---|
| 7,250,715 B2 * | 7/2007 | Mueller et al. | 313/485 |
| 2001/0000622 A1 * | 5/2001 | Reeh et al. | 257/98 |
| 2003/0201451 A1 * | 10/2003 | Suehiro et al. | 257/98 |
| 2004/0124429 A1 * | 7/2004 | Stokes et al. | 257/98 |
| 2004/0207998 A1 * | 10/2004 | Suehiro et al. | 362/84 |
| 2004/0217692 A1 * | 11/2004 | Cho et al. | 313/503 |
| 2006/0099449 A1 * | 5/2006 | Amano et al. | 428/690 |
| 2006/0113553 A1 * | 6/2006 | Srivastava et al. | 257/94 |
| 2007/0057269 A1 * | 3/2007 | Ueda | 257/98 |
| 2008/0048200 A1 * | 2/2008 | Mueller et al. | 257/98 |
| 2008/0191620 A1 * | 8/2008 | Moriyama et al. | 313/506 |
| 2009/0242917 A1 * | 10/2009 | Inoue et al. | 257/98 |
| 2010/0059777 A1 * | 3/2010 | Bechtel et al. | 257/98 |

* cited by examiner

LIGHT EMITTING DEVICE

CROSS-REFERENCE TO RELATED APPLICATION

This application claims priority of Taiwanese Application No. 096107821, filed on Mar. 7, 2007.

BACKGROUND OF THE INVENTION

1. Field of the Invention

This invention relates to a light emitting device, more particularly to a white light emitting device having two wavelength-converting layers.

2. Description of the Related Art

FIG. 1 illustrates a conventional white light emitting device that includes a die-mounting cup 11, a blue light emitting diode 12 mounted in the die-mounting cup 11, and a phosphor layer 13 enclosing the blue light emitting diode 12 for converting blue light into yellow light. Mixing of blue light and yellow light produces white light. However, due to a higher light intensity and a shorter traveling length at a normal direction ($L_n$) of the blue light emitting diode 12 than at side directions ($L_s$), the white light emerging from the side directions ($L_s$) is likely to be yellowish and the light emerging from the normal direction ($L_n$) is likely to be bluish. FIG. 2 shows the measured x and y coordinate chromatic values of the conventional white light emitting device measured according to the color model of the Commission International del'Eclairage (CIE). The results show that the chromatic value of the aforesaid conventional light emitting device for each x and y coordinate is a curve throughout different angles and has a lowest value at the normal direction ($L_n$), i.e., at zero degree angle, and a highest value at each of the side directions ($L_s$), i.e., at angles above 60 degrees. This color deviation is undesired and is gradually enlarged with the increase of the angle relative to the normal direction, which results in nonuniform light. In addition, the color deviation will be worsened in current LED development and new applications, which use a high power light emitting diode and a large die-mounting cup.

SUMMARY OF THE INVENTION

Therefore, the object of the present invention is to provide a light emitting device that can overcome the aforesaid drawbacks associated with the prior art.

According to this invention, there is provided a light emitting device that comprises: a die-mounting base having a mounting surface; a light emitting diode mounted on the mounting surface of the die-mounting base and having a top surface facing in a normal direction normal to the mounting surface of the die-mounting base; a first wavelength-converting layer of a first wavelength-converting material formed on the mounting surface of the die-mounting base, enclosing the light emitting diode, and having a top surface; and a second wavelength-converting layer of a second wavelength-converting material formed on the top surface of the first wavelength-converting layer and having a top surface that is aligned with the top surface of the light emitting diode in the normal direction, and that has an area smaller than the top surface of the first wavelength-converting layer and not smaller than the top surface of the light emitting diode.

BRIEF DESCRIPTION OF THE DRAWINGS

Other features and advantages of the present invention will become apparent in the following detailed description of the preferred embodiment of this invention, with reference to the accompanying drawings, in which.

DETAILED DESCRIPTION OF THE PREFERRED EMBODIMENT

Figure 1:
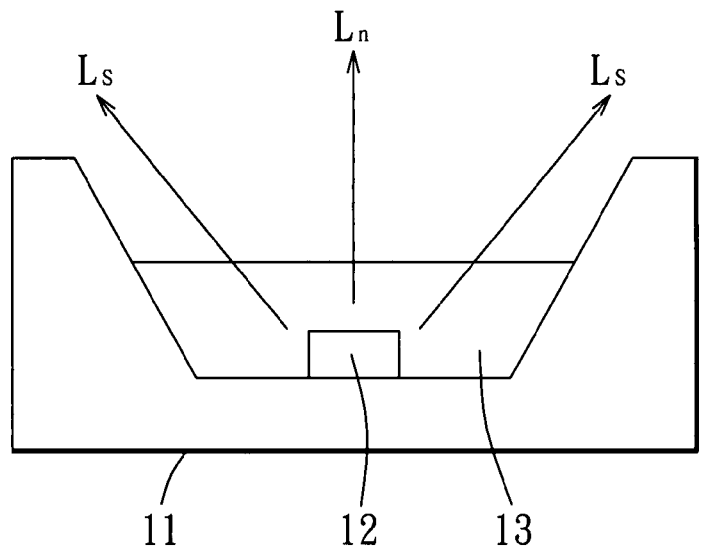
FIG. 1 is a schematic view of a conventional white light emitting device.
Figure 2:
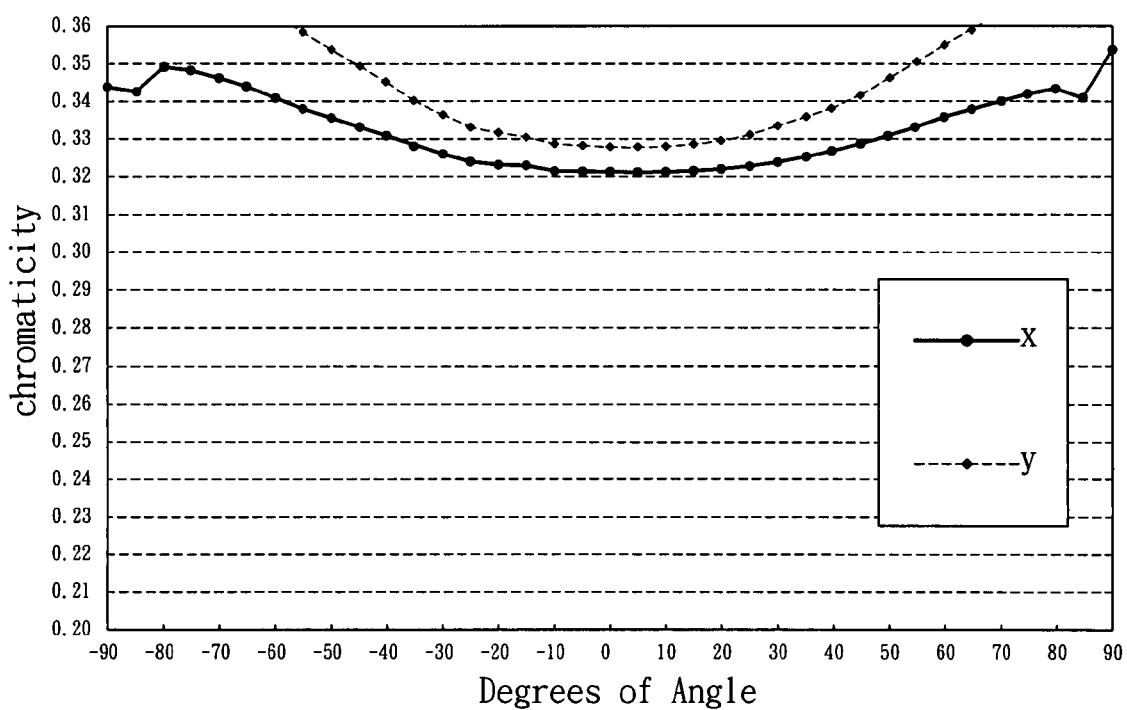
FIG. 2 is a chromaticity diagram showing measured chromaticity of the conventional white light emitting device.
Figure 3:
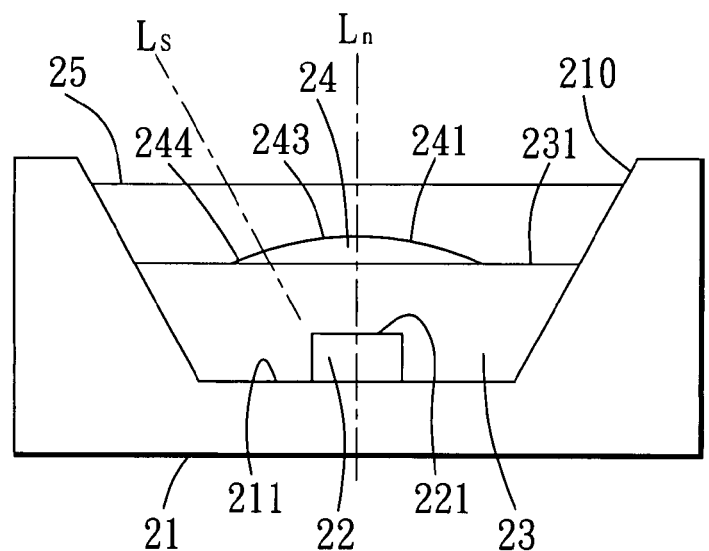
FIG. 3 is a schematic view of the preferred embodiment of a white light emitting device according to this invention.
Figure 4:
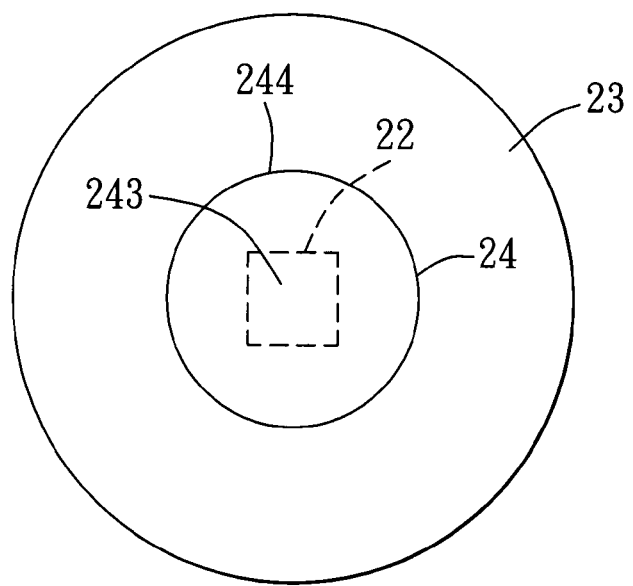
FIG. 4 is a schematic top view of the preferred embodiment.

FIGS. 3 and 4 illustrate the preferred embodiment of a white light emitting device according to this invention. The white light emitting device includes: a die-mounting base 21 having a mounting surface 211; a light emitting diode 22 mounted on the mounting surface 211 of the die-mounting base 21 and having a top surface 221 facing in a normal direction ($L_n$) normal to the mounting surface 211 of the die-mounting base 21; a first wavelength-converting layer 23 of a first wavelength-converting material formed on the mounting surface 211 of the die-mounting base 21, enclosing the light emitting diode 22, and having a top surface 231; and a second wavelength-converting layer 24 of a second wavelength-converting material formed on the top surface 231 of the first wavelength-converting layer 23 and having a top surface 241 that is aligned with the top surface 221 of the light emitting diode 22 in the normal direction ($L_n$), and that has an area smaller than the top surface 231 of the first wavelength-converting layer 23 and not smaller than the top surface 221 of the light emitting diode 22.

In this embodiment, the second wavelength-converting layer 24 has a layer thickness that is gradually decreased from a central portion 243 toward a peripheral portion 244 thereof so as to reduce the aforesaid color deviation throughout different angles from the normal direction ($L_n$) to the side direction(s) ($L_s$).

Preferably, the area ratio of the top surface 241 of the second wavelength-converting layer 24 to the top surface 221 of the light emitting diode 22 ranges from 1:1 to 4:1, and is more preferably 3:1. The area ratio of the top surface 231 of the first wavelength-converting layer 23 to the top surface 241 of the second wavelength-converting layer 24 is preferably 3:1.

Preferably, the die-mounting base 21 has a cup shape, and defines a recess 210. The light emitting diode 22 and the first and second wavelength-converting layers 23, 24 are disposed in the recess 210.

Each of the first and second wavelength-converting materials contains a transparent matrix and particulate phosphor component dispersed in the transparent matrix. Preferably, the transparent matrix is made from a material selected from the group consisting of silicone and epoxy resin.

A protective layer 25 is applied to cover the first and second wavelength-converting layers 23, 24, and is preferably made from silicone to isolate the latter from ambient air and moisture. Light scattering particles can be dispersed in the protective layer 25 to provide a light scattering effect, and are preferably made from a material selected from the group consisting of silicon dioxide, aluminum oxide, calcium oxide, and titanium dioxide.

To achieve a white light, combinations of the light emitting diode 22 and the particulate phosphor component can be as follows. When the particulate phosphor component is made of a yellow color emitting phosphor material (wavelength ranging from 520 to 570 nm), a blue light emitting diode (wavelength ranging from 400 to 470 nm) is selected as the light emitting diode 22, and when the particulate phosphor component is made of a mixture of a red color emitting phosphor material (wavelength ranging from 590 to 650 nm), a green color emitting phosphor material (wavelength ranging from 500 to 530 nm) and a blue color emitting phosphor material (wavelength ranging from 440 to 480 nm), a UV light emitting diode (wavelength ranging 300 to 400 nm) is selected as the light emitting diode 22.

Since the color deviation is gradually increased with the increase of the light emerging angle relative to the normal direction, formation of the second wavelength-converting layer 24 is preferably conducted by applying the second wavelength-converting material onto the top surface 231 of the first wavelength-converting layer 23 in a dropwise manner, which permits formation of the second wavelength-converting layer 24 into a shape with a layer thickness gradually decreased from the central portion 243 to the peripheral portion 244 thereof. It is noted that due to the surface tension of the applied drop of the second wavelength-converting material on the first wavelength-converting layer 23, the layer thickness of the second wavelength-converting layer 24 varies with the area of the second wavelength-converting layer 24, i.e., the layer thickness and the area of the dimensions are related to each other. As such, it is difficult to achieve a perfect white light from the light emitting device thus formed. The applicants found that by having the phosphor component concentration in the transparent matrix of the second wavelength-converting layer 24 higher than that of the first wavelength-converting layer 23, a near perfect white light can be achieved. In this preferred embodiment, the concentration ratio of the particulate phosphor component in the transparent matrix of the second wavelength-converting layer 24 to that of the first wavelength-converting layer 23 is 1.1:1. The light emitting device thus formed can achieve a uniform white light throughout the angles relative to the normal direction ($L_n$).

Figure 5:
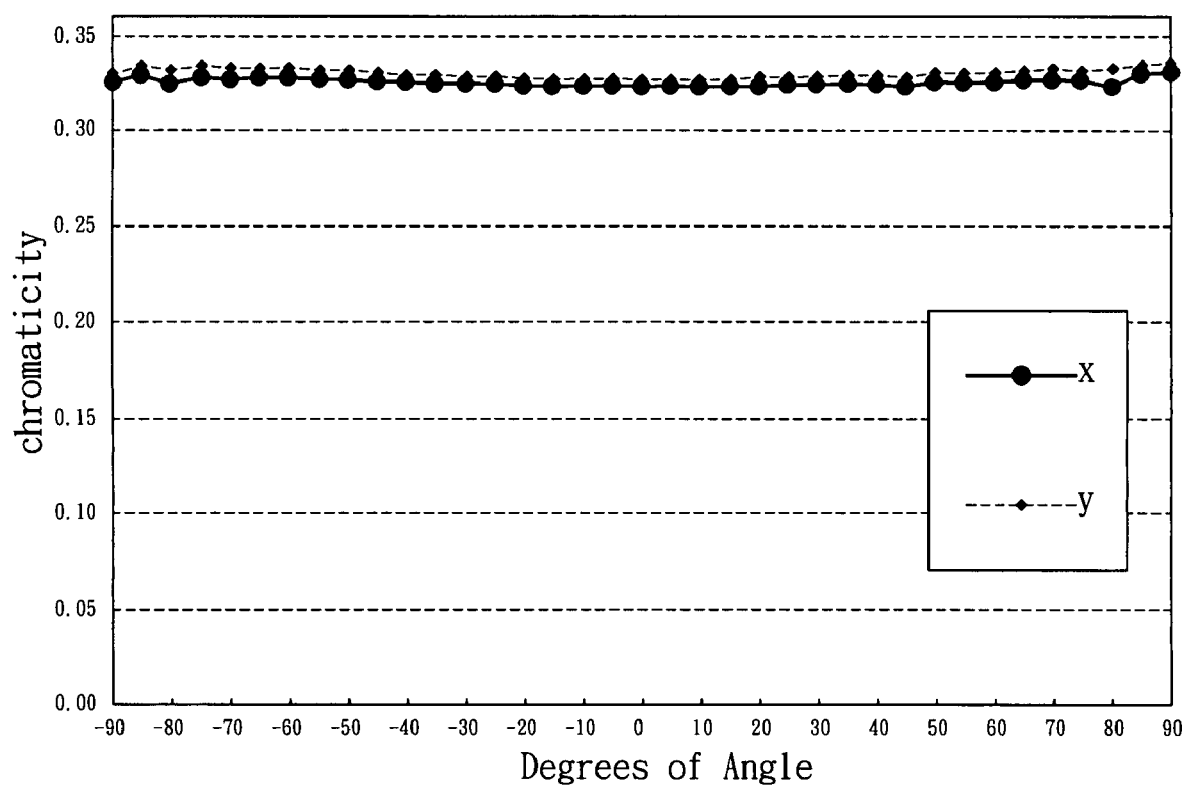
FIG. 5 is a chromaticity diagram showing measured chromaticity of the preferred embodiment.

FIG. 5 shows the measured x and y coordinate chromatic values of the white light emitting device of this invention measured according to the color model of the Commission International del'Eclairage (CIE). The results show that the color deviation of the light emitting device of this invention throughout the angles relative to the normal direction ($L_n$) for each of the x and y coordinates is substantially eliminated.

With the inclusion of the second wavelength-converting layer 24 in the light emitting device of this invention and by imparting the second wavelength-converting layer 24 with a higher phosphor component concentration than that of the first wavelength-converting layer 23, the aforesaid drawbacks associated with the prior art can be eliminated.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A light emitting device comprising:
   a die-mounting base having a mounting surface;
   a light emitting diode mounted on said mounting surface of said die-mounting base and having a top surface facing in a normal direction normal to said mounting surface of said die-mounting base;
   a first wavelength-converting layer of a first wavelength-converting material formed on said mounting surface of said die-mounting base, enclosing said light emitting diode, and having a top surface; and
   a second wavelength-converting layer of a second wavelength-converting material formed on said top surface of said first wavelength-converting layer and having a top surface that is aligned with said top surface of said light emitting diode in the normal direction, and that has an area smaller than said top surface of said first wavelength-converting layer and not smaller than said top surface of said light emitting diode.

2. The light emitting device of claim 1, wherein said die-mounting base defines a recess, said light emitting diode and said first and second wavelength-converting layers being disposed in said recess.

3. The light emitting device of claim 1, wherein each of said first and second wavelength-converting materials contains a transparent matrix and a particulate phosphor component dispersed in said transparent matrix.

4. The light emitting device of claim 3, wherein said transparent matrix is made from a material selected from the group consisting of silicone and epoxy resin.

5. The light emitting device of claim 3, wherein the concentration of said particulate phosphor component in said transparent matrix of said second wavelength-converting layer is higher than that of said first wavelength-converting layer.

6. The light emitting device of claim 3, wherein the concentration ratio of said particulate phosphor component in said transparent matrix of said second wavelength-converting layer to that of said first wavelength-converting layer is 1.1:1.

7. The light emitting device of claim 1, wherein the area ratio of said top surface of said second wavelength-converting layer to said top surface of said light emitting diode ranges from 1:1 to 4:1.

8. The light emitting device of claim 7, wherein the area ratio of said top surface of said first wavelength-converting layer to said top surface of said second wavelength-converting layer is 3:1.

9. The light emitting device of claim 1, wherein said second wavelength-converting layer has a central portion, a peripheral portion, and a layer thickness that is gradually decreased from said central portion toward said peripheral portion.

10. The light emitting device of claim 1, further comprising a protective layer covering said first and second wavelength-converting layers.

11. The light emitting device of claim 3, further comprising light-scattering particles dispersed in said transparent matrix.

12. The light emitting device of claim 11, wherein said light-scattering particles are made from a material selected from the group consisting of silicon dioxide, aluminum oxide, calcium oxide, and titanium dioxide.

13. The light emitting device of claim 1, wherein said light emitting diode is a blue light emitting diode.

14. The light emitting device of claim 1, wherein said light emitting diode is a UV light emitting diode.

* * * * *